(12) United States Patent
Zhang

(10) Patent No.: US 10,553,616 B2
(45) Date of Patent: Feb. 4, 2020

(54) ARRAY SUBSTRATE AND METHOD OF MANUFACTURING THE SAME

(71) Applicant: WUHAN CHINA STAR OPTOELECTRONICS TECHNOLOGY CO., LTD, Wuhan, Hubei (CN)

(72) Inventor: Zhandong Zhang, Hubei (CN)

(73) Assignee: Wuhan China Star Optoelectronics Technology Co., Ltd., Wuhan, Hubei (CN)

( * ) Notice: Subject to any disclaimer, the term of this patent is extended or adjusted under 35 U.S.C. 154(b) by 161 days.

(21) Appl. No.: 15/577,705

(22) PCT Filed: Sep. 6, 2017

(86) PCT No.: PCT/CN2017/100718
§ 371 (c)(1),
(2) Date: Nov. 28, 2017

(87) PCT Pub. No.: WO2019/019278
PCT Pub. Date: Jan. 31, 2019

(65) Prior Publication Data
US 2019/0081074 A1    Mar. 14, 2019

(30) Foreign Application Priority Data

Jul. 24, 2017 (CN) .......................... 2017 1 0606999

(51) Int. Cl.
*H01L 29/786* (2006.01)
*H01L 27/12* (2006.01)

(52) U.S. Cl.
CPC ........ *H01L 27/124* (2013.01); *H01L 27/1262* (2013.01); *H01L 29/78675* (2013.01); *H01L 27/1251* (2013.01); *H01L 29/78621* (2013.01)

(58) Field of Classification Search
CPC ............. H01L 27/124; H01L 29/78673; H01L 27/1262; H01L 21/775; H01L 27/12; H01L 29/4908; H01L 27/1288
(Continued)

(56) References Cited

U.S. PATENT DOCUMENTS 9,647,009 B1 * 5/2017 Zhao et al. ......... H01L 27/1248
9,671,646 B1 * 6/2017 Tang ..................... G02F 1/1341
(Continued)

FOREIGN PATENT DOCUMENTS

| CN | 105140244 A | 12/2015 |
|---|---|---|
| CN | 106158882 A | 11/2016 |
| CN | 106847743 A | 6/2017 |

*Primary Examiner* — Thinh T Nguyen
(74) *Attorney, Agent, or Firm* — Mintz Levin Cohn Ferris Glovsky and Popeo, P.C.; Steven M. Jensen

(57) ABSTRACT

The present disclosure provides an array substrate and a method of manufacturing the same. The array substrate includes a substrate, a buffer layer, an active layer, a gate insulating layer with a second via hole, a gate, an interlayer insulating layer with a first via hole, a source electrode contacting the active layer through the first and second via holes, a planarization layer with a third via hole, a common electrode with a fourth via hole and a passivation layer sequentially disposed on the substrate, and a pixel electrode disposed on the passivation layer contacts the active layer through a fifth via hole passing through the fourth and third via holes, the interlayer insulating layer, and the gate insulating layer. According to present disclosure, static electricity generated in manufacturing is effectively prevented from being transferred to the active layer to cause Electro-Static discharge, which further improves the product quality.

8 Claims, 6 Drawing Sheets

(58) Field of Classification Search
USPC .......... 257/72, 59, 81; 438/48, 128, 149, 22
See application file for complete search history.

(56) References Cited

U.S. PATENT DOCUMENTS

| | | | |
|---|---|---|---|
| 2008/0018816 A1* | 1/2008 | Hattori et al. | G02F 1/136213 349/39 |
| 2018/0226438 A1* | 8/2018 | Liu | H01L 27/1288 |

* cited by examiner

ARRAY SUBSTRATE AND METHOD OF MANUFACTURING THE SAME

CROSS-REFERENCES TO RELATED APPLICATIONS

This application is a U.S. national phase application, pursuant to 35 U.S.C. § 371, of PCT/CN2017/100718, filed Sep. 6, 2017, designating the United States, which claims priority to Chinese Application No. 201710606999.8, filed Jul. 24, 2017. The entire contents of the aforementioned patent applications are incorporated herein by this reference.

TECHNICAL FIELD

The present disclosure relates to a display panel technology, especially to a Low Temperature Poly-Silicon array substrate and a method of manufacturing the same.

RELATED ART

In a Low Temperature Poly-Silicon thin film transistor liquid crystal display (LTPS TFT LCD), and in the manufacturing process of a traditional thin film transistor array substrate, firstly a buffer layer, an active layer, a gate insulating layer and a gate are sequentially manufactured on the substrate, then an interlayer insulating layer is manufactured and etched to form via holes etched to source and drain terminals of the active layer, the via holes all expose a portion of the active layer, and a source\drain electrode, a planarization layer, a common electrode, a passivation layer and a pixel electrode are then manufactured, and the pixel electrode contacts the drain electrode; in the traditional process, the via holes used for the pixel electrode to contact the active layer are formed starting from the interlayer insulating layer, and after the etching of the interlayer insulating layer (ILD), the active layer (poly Si) for contacting with the pixel electrode is exposed; and in the preceding manufacturing process, such as the source\drain electrode (SD), the passivation layer (PLN), the common electrode (Com ITO), the passivation layer (PV CVD), and the pixel electrode (Pixel ITO), generated static electricity may be very easy to be transferred to the active layer (poly Si), as a result, an Electro-Static discharge (ESD) explosion occurs in the active layer at the interlayer insulating layer via holes and the gate regions, which causes the manufacturing process to be abnormal, and effects the product quality.

SUMMARY

In order to overcome the disadvantages in the existing arts, the present disclosure provides an array substrate and a method of manufacturing the same, which can prevent static generated in manufacturing from being transferred to an active layer to cause Electro-Static discharge, avoid product performance failure, and improve the product quality.

The present disclosure provides an array substrate including a substrate, a buffer layer, an active layer, a gate insulating layer, a gate, an interlayer insulating layer, a source electrodecontacting the active layer through a first via hole of the interlayer insulating layer and a second via hole of the gate insulating layer, a planarization layer, a common electrode and a passivation layer sequentially disposed on the substrate, the common electrode has a fourth via hole disposed at the active layer, the planarization layer has a third via hole disposed at the fourth via hole, the passivation layer has a fifth via hole passing through the fourth via hole, the third via hole, the planarization layer, the interlayer insulating layer, and the gate insulating layer, the passivation layer also has a pixel electrode disposed thereon, and the pixel electrode contacts the active layer through the fifth via hole.

Furthermore, the third via hole and the fourth via hole are disposed on a same axis.

Furthermore, the fifth via hole is formed by a sixth via hole disposed on the gate insulating layer, a seventh via hole disposed on the interlayer insulating layer, an eighth via hole disposed in the third via hole, a ninth via hole disposed in the fourth via hole and a tenth via hole disposed on the passivation layer, and the sixth via hole, the seventh via hole, the eighth via hole, the ninth via hole and the tenth via hole are disposed on a same axis.

Furthermore, the fifth via hole, the third via hole and the fourth via hole are disposed on a same axis.

Furthermore, the apertures of the sixth via hole, the seventh via hole, the eighth via hole, the ninth via hole and the tenth via hole are the same and less than that of the fourth via hole.

The present disclosure further provides a method of manufacturing the array substrate, including the following steps:

providing a substrate;
manufacturing a buffer layer on the substrate;
manufacturing an active layer on the buffer layer;
manufacturing the gate insulating layer on the buffer layer and the active layer;
manufacturing a gate on the gate insulating layer at the active layer;
manufacturing an interlayer insulating layer on the gate and gate insulating layer;
manufacturing a first via hole and a second via hole on the interlayer insulating layer and an end of the gate insulating layer at the active layer;
manufacturing a source electrode contacting the active layer through the first via hole and the second via hole on the interlayer insulating layer;
manufacturing a planarization layer on the source electrode and the interlayer insulating layer, and manufacturing a third via hole on the planarization layer at a position opposite to another end of the active layer;
manufacturing a common electrode on the planarization layer and manufacturing a fourth via hole on the common electrode at the third via hole;
manufacturing a passivation layer filling the third via hole and the fourth via hole on the common electrode;
manufacturing a fifth via hole passing through the fourth via hole, the third via hole, the interlayer insulating layer, and the gate insulating layer at the fourth via hole on the passivation layer; and
manufacturing a pixel electrode contacting another end of the active layer through the fifth via hole on the passivation layer.

Furthermore, the third via hole and the fourth via hole are disposed on a same axis.

Furthermore, the fifth via hole is formed by a sixth via hole disposed on the gate insulating layer, a seventh via hole disposed on the interlayer insulating layer, an eighth via hole disposed in the third via hole, a ninth via hole disposed in the fourth via hole and a tenth via hole disposed on the passivation layer, and the sixth via hole, the seventh via hole, the eighth via hole, the ninth via hole and the tenth via hole are disposed on a same axis.

Furthermore, the fifth via hole, the third via hole and the fourth via hole are disposed on a same axis.

Furthermore, apertures of the sixth via hole, the seventh via hole, the eighth via hole, the ninth via hole and the tenth via hole are equal to each other, and are less than that of the fourth via hole.

Compared with the existing art, in the present disclosure, only the source electrode is manufactured when manufacturing the source and drain electrodes for contacting the active layer, while the drain electrode for connecting the pixel electrode to the active layer is not manufactured, so that one end of the active layer for connecting the pixel electrode is protected in the manufacturing from the interlayer insulating layer to the passivation layer, thereby effectively preventing static generated in manufacturing from the interlayer insulating layer to the passivation layer from being transferred to the active layer to cause Electro-Static discharge, to avoid the problem that the active layer is exploded and product performance is caused to fail, to further improve the product quality.

DETAILED DESCRIPTION OF EXEMPLARY EMBODIMENTS

The present disclosure is further explained below in detail in conjunction with the accompanying drawings and exemplary embodiments.

Figure 6:
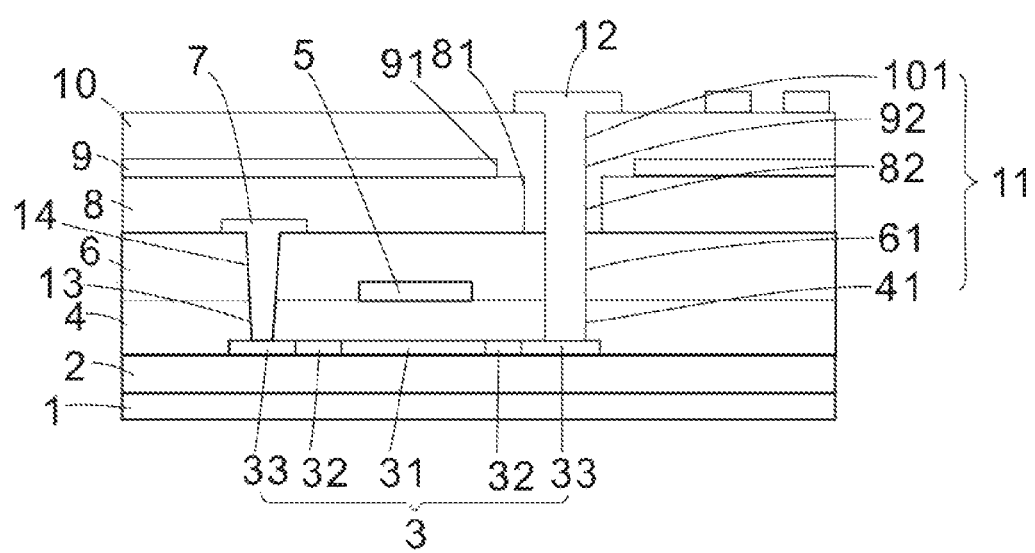
FIG. 6 is a structural diagram of manufacturing a pixel electrode of the present disclosure.

As shown in FIG. 6, an array substrate of the present disclosure includes a substrate 1, a buffer layer 2, an active layer 3, a gate insulating layer 4, a gate 5, an interlayer insulating layer 6, a source electrode 7 contacting the active layer 3 through a first via hole 13 of the interlayer insulating layer 6 and a second via hole 14 of the gate insulating layer 4, a planarization layer 8, a common electrode 9 and a passivation layer 10 sequentially disposed on the substrate 1; the common electrode 9 has a fourth via hole 91 disposed at the active layer 3, the planarization layer 8 has a third via hole 81 disposed at the fourth via hole 91, the passivation layer 10 has a fifth via hole 11 passing through the fourth via hole 91, the third via hole 81, the planarization layer 8, the interlayer insulating layer 6, and the gate insulating layer 4, the passivation layer 10 also has a pixel electrode 12 disposed thereon, and the pixel electrode 12 contacts the active layer 3 through the fifth via hole 11.

The active layer 3 includes an undoped layer 31, heavily doped layers 33 disposed on both sides of the undoped layer 31, respectively, and lightly doped layers 32 disposed between the heavily doped layers 33 and the undoped layer 31. Here, the lightly doped layers 32 are N-type lightly doped layers, the heavily doped layers 33 are N-type heavily doped layers, but the present disclosure is not limited thereto, for example, the lightly doped layers 32 may also be P-type lightly doped layers, and the heavily doped layers 33 may also be P-type heavily doped layers, the source electrode 7 and the pixel electrode 12 contact the heavily doped layers 33, respectively, the first via hole 13 and the second via hole 14 are disposed at one of the heavily doped layers 33, the third via hole 81, the fourth via hole 91 and the fifth via hole 11 are disposed at the other heavily doped layer 33, and the active layer is formed by low temperature poly-silicon (Poly-Si).

An aperture of the first via hole 13 is greater than that of the second via hole 14, the first via hole 13 and the second via hole 14 are disposed on a same axis, and are all reverse trapezoidal holes.

The third via hole 91 and the fourth via hole 81 are disposed on a same axis and an aperture of the third via hole 91 is greater than that of the fourth via hole 81.

In the present disclosure, the fifth via hole 11 is formed by a sixth via hole 41 disposed on the gate insulating layer 4, a seventh via hole 61 disposed on the interlayer insulating layer 6, an eighth via hole 82 disposed in the third via hole 81, a ninth via hole 92 disposed in the fourth via hole 91 and a tenth via hole 101 disposed on the passivation layer 10, and the sixth via hole 41, the seventh via hole 61, the eighth via hole 82, the ninth via hole 92 and the tenth via hole 101 are disposed on a same axis; wherein the fifth via hole 11, the third via hole 91 and the fourth via hole 81 are disposed on a same axis; and the apertures of the sixth via hole 41, the seventh via hole 61, the eighth via hole 82, the ninth via hole 92 and the tenth via hole 101 are equal to each other, and are less than that of the fourth via hole 81.

Figure 1:
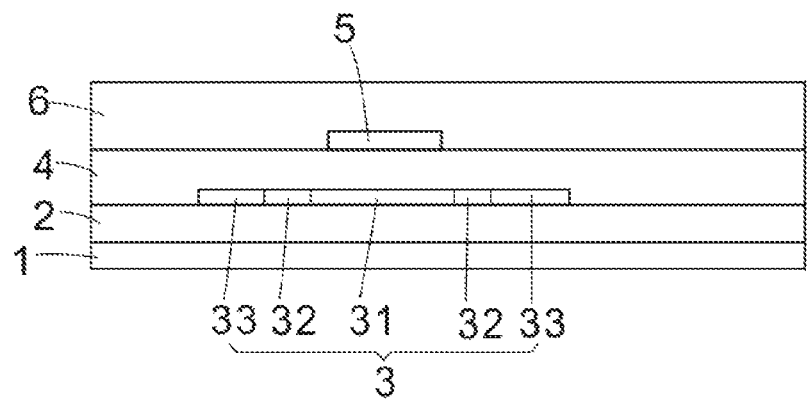
FIG. 1 is a structural diagram of manufacturing an interlayer insulating layer of the present disclosure.
Figure 2:
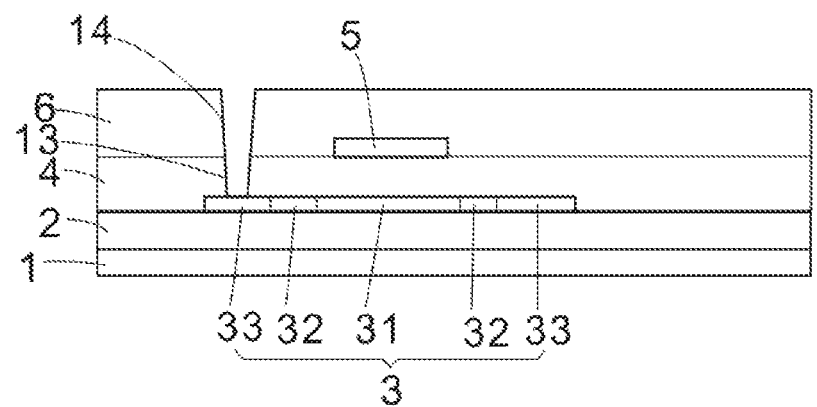
FIG. 2 is a structural diagram of manufacturing a via hole on an interlayer insulating layer of the present disclosure.
Figure 3:
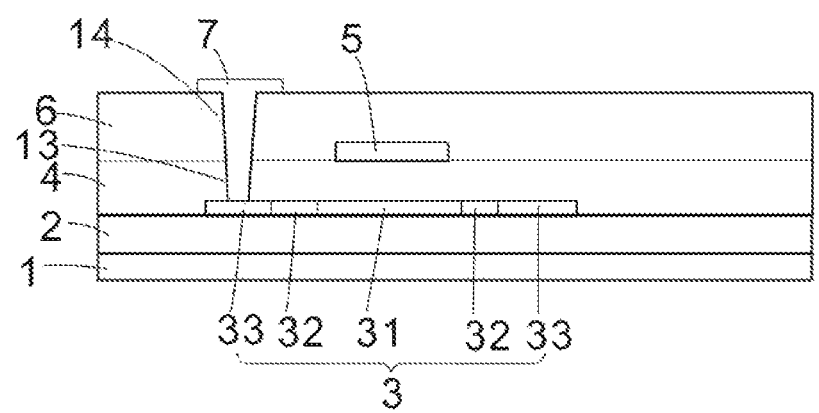
FIG. 3 is a structural diagram of manufacturing a source electrode of the present disclosure.
Figure 4:
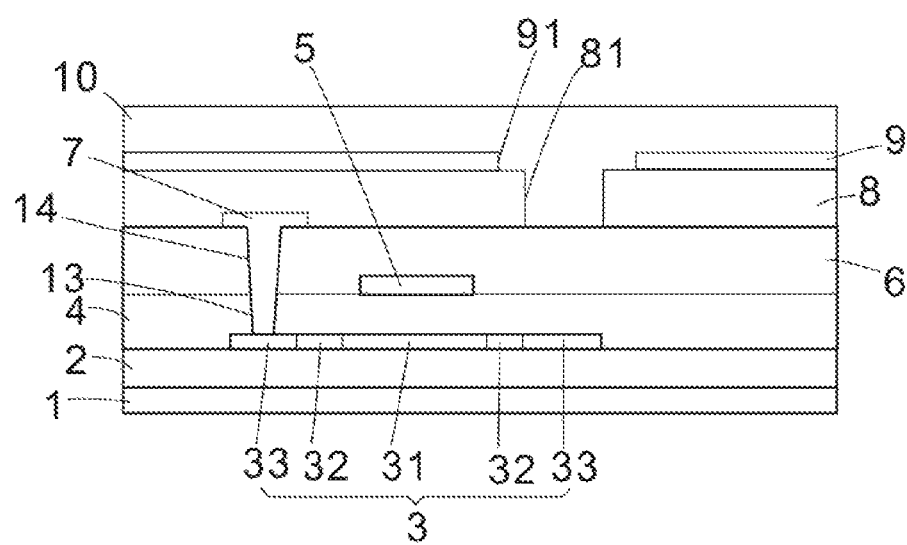
FIG. 4 is a structural diagram of manufacturing a planarization layer, a common electrode and a passivation layer of the present disclosure.
Figure 5:
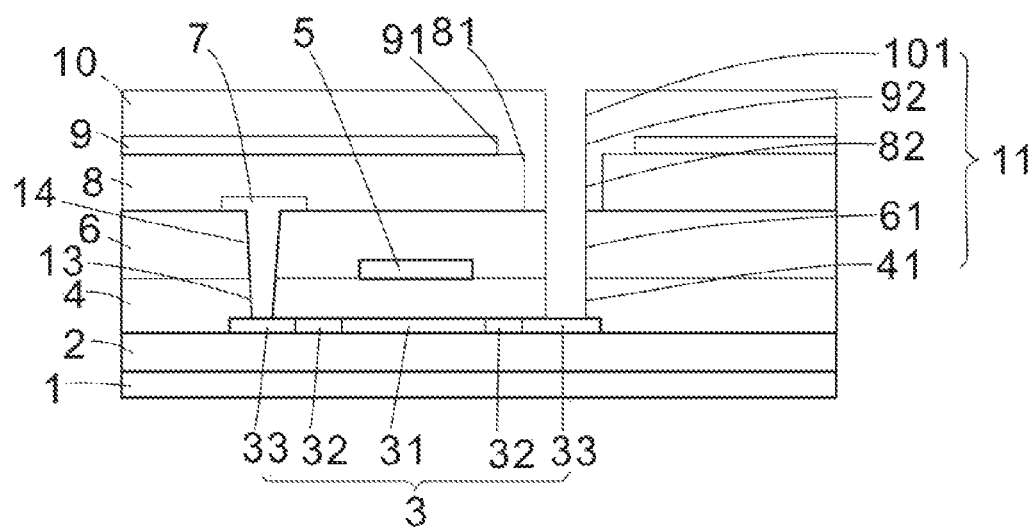
FIG. 5 is a structural diagram of manufacturing a fifth via hole of the present disclosure.

The method of manufacturing the array substrate of the present disclosure includes the following steps:

Step I, the substrate 1 is provide;

Step II, the buffer layer 2 is manufactured on the substrate 1, specifically, the buffer layer 2 may manufactured by using a chemical vapor deposition (CVD), and the buffer layer 2 may be a $SiN_x/SiO_x$ structure, but the present disclosure is not limited thereto, for example, the buffer layer 2 may also be a single-layer $SiN_x$ structure or a $SiO_x$ structure;

Step III, the active layer 3 is manufactured on the buffer layer 2, specifically, an amorphous silicon layer is manufactured on the buffer layer 2 by using a plasma enhanced chemical vapor deposition (PECVD) method; and then the amorphous silicon layer is recrystallized by using an excimer laser so as to generate the active layer 3 of low temperature Poly-Si. The active layer 3 includes an undoped layer 31, heavily doped layers 33 disposed on both sides of the undoped layer 31, respectively, and lightly doped layers 32 disposed between the heavily doped layers 33 and the undoped layer 31. Here, the lightly doped layers 32 are N-type lightly doped layers, the heavily doped layers 33 are N-type heavily doped layers, but the present disclosure is not limited thereto, for example, the lightly doped layers 32 may also be P-type lightly doped layers, and the heavily doped layers 33 may also be P-type heavily doped layers;

Step IV, the gate insulating layer 4 is manufactured on the buffer layer 2 and active layer 3, specifically, the buffer layer 4 may be a $SiN_x/SiO_x$ structure, but the present disclosure is not limited thereto, for example, the buffer layer 4 may also be a single-layer $SiN_x$ structure or a $SiO_x$ structure, and the gate insulating layer 4 in the present disclosure may manufactured by using the chemical vapor deposition (CVD), which are not specifically defined here;

Step V, the gate 5 is manufactured on the gate insulating layer 4 at the active layer 3, specifically, the gate 5 directly faces the undoped layer 31, the gate 5 may be a MoAlMo structure or a TiAlTi structure, and may also be a single-layer Mo structure or a single-layer Al structure, but the present disclosure is not limited thereto; and the gate 5 in the present disclosure may be manufactured through a patterning process after forming a gate layer by using a physical vapor deposition process, which are not specifically defined here;

Step VI, as shown in FIG. 1, the interlayer insulating layer 6 is manufactured on the gate 5 and the gate insulating layer 4, specifically, the interlayer insulating layer 6 may be a $SiN_x/SiO_x$ structure, but the present disclosure is not limited thereto, for example, the interlayer insulating layer 6 may also be a single-layer $SiN_x$ structure or a $SiO_x$ structure, and the interlayer insulating layer 6 in the present disclosure may manufactured by using the chemical vapor deposition (CVD), which are not specifically defined here;

Step VII, as shown in FIG. 2, the first via hole 13 and the second via hole 14 are manufactured on the interlayer insulating layer 6 and one end of the gate insulating layer 4 in the active layer 3, specifically, the first via hole 13 and the second via hole 14 are disposed at one of the heavily doped layers 33 and expose the heavily doped layer 33, and the first via hole 13 and the second via hole 14 may be manufactured by using a etching process, which are not specifically defined here;

Step VIII, as shown in FIG. 3, the source electrode 7 is manufactured on the interlayer insulating layer 6, the source electrode 7 contacts the active layer 3 through the first via hole 13 and the second via hole 14, specifically, the source electrode 7 may use a MoAlMo structure or a TiAlTi structure, and may also be a single-layer Mo structure or a single-layer Al structure, but the present disclosure is not limited thereto; and the source electrode 7 contacts the heavily doped layer 33 through the first via hole 13 and the second via hole 14, an aperture of the first via hole 13 is greater than that of the second via hole 14, the first via hole 13 and the second via hole 14 are disposed on a same axis, and are all reverse trapezoidal holes, and the source electrode 7 may be manufactured through a patterning process after manufacturing the source electrode layer by using the physical vapor deposition, which are not specifically defined here;

Step IX, as shown in FIG. 4, the planarization layer 8 is manufactured on the source electrode 7 and the interlayer insulating layer 6, the third via hole 81 is manufactured on the planarization layer 8 at a position opposite to the other end of the active layer 3, specifically, the third via hole 81 is disposed above the other heavily doped layer 33;

Step X, as shown in FIG. 4, the common electrode 9 is manufactured on the planarization layer 8 and the fourth via hole 91 is manufactured on the common electrode 9 at the third via hole 81, specifically, an aperture of the fourth via hole 91 is greater than that of the third via hole 81, and the fourth via hole 91 and the third via hole 81 are disposed on a same axis; and the common electrode 9 is manufactured through the etching process after forming a transparent conductive film on the planarization layer 8 through the physical vapor deposition, which are not specifically defined here;

Step XI, as shown in FIG. 4, the passivation layer 10 is manufactured on the common electrode 9, the passivation layer 10 fills the third via hole 81 and the fourth via hole 91, specifically, the passivation layer 10 may be a SiNx structure, and the passivation layer 10 may be manufactured through the chemical vapor deposition (CVD), which are not specifically defined here;

Step XII, as shown in FIG. 5, the fifth via hole 11 passing through the fourth via hole 91, the third via hole 81, the interlayer insulating layer 6, and the gate insulating layer 4 is manufactured on the passivation layer 10 at the fourth via hole 91, and the fifth via hole 11, the third via hole 91 and the fourth via hole 81 are disposed on a same axis; and specifically, the fifth via hole 11 exposes the other heavily doped layer 33, the fifth via hole 11 is formed by a sixth via hole 41 disposed on the gate insulating layer 4, a seventh via hole 61 disposed on the interlayer insulating layer 6, an eighth via hole 82 disposed in the third via hole 81, a ninth via hole 92 disposed in the fourth via hole 91 and a tenth via hole 101 disposed on the passivation layer 10, and the sixth via hole 41, the seventh via hole 61, the eighth via hole 82, the ninth via hole 92 and the tenth via hole 101 are disposed on a same axis, apertures of the sixth via hole 41, the seventh via hole 61, the eighth via hole 82, the ninth via hole 92 and the tenth via hole 101 are equal to each other, and are less than that of the fourth via hole 81, and the above via holes may be manufactured through the etching process, which are not specifically defined here; and Step XIII, as shown in FIG. 6, the pixel electrode 12 is manufactured on the passivation layer 10, the pixel electrode 12 contacts the other end of the active layer 4 through the fifth via hole 11, specifically, the pixel electrode 12 directly contacts the other heavily doped layer 33, and the common electrode 12 may be manufactured through the etching process after forming a transparent conductive film on the passivation layer 10 through the physical vapor deposition PVD manufacturing method, which are not specifically defined here.

Compared with the traditional LTPS process structure, in the present disclosure, the via hole is disposed on the interlayer insulating layer only at one heavily doped layer for connecting the source electrode and the active layer, while the other heavily doped layer for contacting the pixel electrode is not disposed with the via hole, so that the manufacturing process from the interlayer insulating layer to the passivation layer is protected, which effectively prevents static electricity generated in manufacturing process from the interlayer insulating layer to the passivation layer from being transferred to the active layer to cause Electro-Static discharge to explode the active layer, so that the product performance failure may be avoided, and the product quality may be improved.

Although the present disclosure has been described with reference to specific exemplary embodiments, those skilled in the art will understand that various changes in form and details may be made therein without departing from the spirit and scope of the invention as defined by the appended claims and its equivalents.

What is claimed is:

1. An array substrate, comprising a substrate, a buffer layer, an active layer, a gate insulating layer, a gate, an interlayer insulating layer, a source electrode contacting the active layer through a first via hole of the interlayer insulating layer and a second via hole of the gate insulating layer, a planarization layer, a common electrode and a passivation layer sequentially disposed on the substrate, the common electrode having a fourth via hole disposed at the active layer, the planarization layer having a third via hole disposed at the fourth via hole, the passivation layer having a fifth via hole passing through the fourth via hole, the third via hole, the planarization layer, the interlayer insulating layer, and the gate insulating layer, the passivation layer also having a pixel electrode disposed thereon, and the pixel electrode contacting the active layer through the fifth via hole, wherein the passivation layer is disposed on the common electrode, fills the fourth via hole and the third via hole, and contacts the interlayer insulating layer through the fourth via hole and the third via hole.

2. The array substrate of claim 1, wherein the third via hole and the fourth via hole are disposed on a same axis.

3. The array substrate of claim 1, wherein the fifth via hole is formed by a sixth via hole disposed on the gate insulating layer, a seventh via hole disposed on the interlayer insulating layer, an eighth via hole disposed in the third via hole, a ninth via hole disposed in the fourth via hole and a tenth via hole disposed on the passivation layer, and the sixth via hole, the seventh via hole, the eighth via hole, the ninth via hole and the tenth via hole are disposed on a same axis.

4. The array substrate of claim 2, wherein the fifth via hole is formed by a sixth via hole disposed on the gate insulating layer, a seventh via hole disposed on the interlayer insulating layer, an eighth via hole disposed in the third via hole, a ninth via hole disposed in the fourth via hole and a tenth via hole disposed on the passivation layer, and the sixth via hole, the seventh via hole, the eighth via hole, the ninth via hole and the tenth via hole are disposed on a same axis.

5. The array substrate of claim 3, wherein the fifth via hole, the third via hole and the fourth via hole are disposed on a same axis.

6. The array substrate of claim 4, wherein the fifth via hole, the third via hole and the fourth via hole are disposed on a same axis.

7. The array substrate of claim 5, wherein the apertures of the sixth via hole, the seventh via hole, the eighth via hole, the ninth via hole and the tenth via hole are equal to each other, and are less than that of the fourth via hole.

8. The array substrate of claim 6, wherein the apertures of the sixth via hole, the seventh via hole, the eighth via hole, the ninth via hole and the tenth via hole are equal to each other, and are less than that of the fourth via hole.

* * * * *